United States Patent [19]

Kusakabe

[11] Patent Number: 5,516,706
[45] Date of Patent: May 14, 1996

[54] METHOD OF MANUFACTURING SEMICONDUCTOR DEVICE WITH A GETTERING SINK MATERIAL LAYER

[75] Inventor: Kenji Kusakabe, Hyogo, Japan

[73] Assignee: Mitsubishi Denki Kabushiki Kaisha, Tokyo, Japan

[21] Appl. No.: 323,411

[22] Filed: Oct. 14, 1994

Related U.S. Application Data

[62] Division of Ser. No. 20,080, Feb. 19, 1993, Pat. No. 5,374,842.

[30] Foreign Application Priority Data

| Feb. 21, 1992 | [JP] | Japan | 4-035179 |
| Feb. 1, 1993 | [JP] | Japan | 5-014891 |

[51] Int. Cl.$^6$ .................................... H01L 21/322
[52] U.S. Cl. .................................... 437/12; 437/10
[58] Field of Search .................................... 437/10, 12, 13; 297/487, 629, 913; 148/33.3, DIG. 60

[56] References Cited

U.S. PATENT DOCUMENTS

| 4,053,335 | 10/1977 | Hu. | |
| 4,375,125 | 3/1983 | Byatt | 148/187 |
| 4,631,809 | 12/1986 | Roy | 437/12 |
| 4,828,629 | 5/1989 | Ikeda et al. | 437/12 |
| 4,985,372 | 1/1991 | Narita | 437/946 |
| 5,189,508 | 2/1993 | Tachimoro et al. | 437/12 |

FOREIGN PATENT DOCUMENTS

| 1-235242 | 9/1989 | Japan. |
| 1-315144 | 12/1989 | Japan. |
| 2-38467 | 3/1990 | Japan. |
| 3-273639 | 12/1991 | Japan. |

*Primary Examiner*—George Fourson
*Assistant Examiner*—S. Mulpuri
*Attorney, Agent, or Firm*—Lowe, Price, LeBlanc & Becker

[57] ABSTRACT

Silicon substrate is provided with silicon single-crystalline wafer, natural oxide film and poly-crystalline silicon film. The thickness of natural oxide film is controlled to be less than 10 Å. Since the thickness of natural oxide film is made less than 10 Å, heavy metals travel smoothly from silicon single-crystalline wafer to poly-crystalline silicon film in the process of gettering. In other words, it is possible to enhance gettering effect.

15 Claims, 12 Drawing Sheets

METHOD OF MANUFACTURING SEMICONDUCTOR DEVICE WITH A GETTERING SINK MATERIAL LAYER

This application is a division of application Ser. No. 08/020,080 filed Feb. 19, 1993, U.S. Pat. No. 5,374,842.

BACKGROUND OF THE INVENTION

1. Field of the Invention

The present invention relates to a semiconductor substrate having a layer of gettering sink material formed thereon, a method of manufacturing the semiconductor substrate and a semiconductor device using the semiconductor substrate.

2. Description of the Background Art

A semiconductor device is fabricated by combination of the steps of film formation, washing, thermal treatment, photolithography and the like. Heavy metals such as Fe, Ni, Cr, Cu, Zn and the like are inevitably mixed in, for example, a washing solution for use in the step of washing and resist for use in the step of photolithography. Therefore, these heavy metals often enter a semiconductor device.

One example of the problems that occur when heavy metals enter a semiconductor device is that, when heavy metals enter a PN junction, the region of the junction acquires a crystal defect to cause current leakage.

Among steps for manufacturing a semiconductor device, the step of removing heavy metals which entered the semiconductor device is referred to as gettering. There are various kinds of gettering. The following description will be given to gettering carried out by formation of a poly-crystalline silicon film on the rear surface, having no elements formed thereon, of the surface of a silicon single-crystalline wafer.

When the poly-crystalline silicon film is formed on the rear surface of the silicon single-crystalline wafer, gettering is carried out on the following two theories.
(Theory 1)

Figure 23:
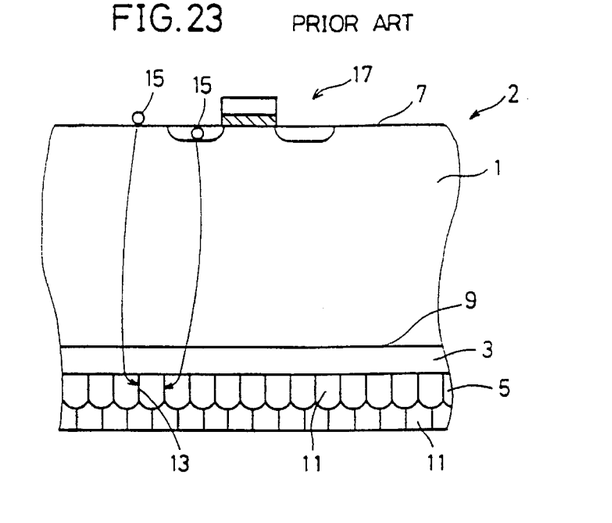
FIG. 23 is a partially enlarged view of a silicon substrate for explaining Theory 1 for gettering.

FIG. 23 is an enlarged cross section of a portion of a silicon substrate 2. Silicon substrate 2 has a poly-crystalline silicon film 5 formed on a rear surface 9 of a silicon single-crystalline wafer 1. A number of grains 11 gather to form poly-crystalline silicon film 5. A boundary of respective grains 11 is called a grain boundary 13.

A natural oxide film 3 is formed between rear surface 9 and poly-crystalline silicon film 5. Natural oxide film 3 is formed inevitably when poly-crystalline silicon film 5 is formed on rear surface 9.

An MOS (Metal-Oxide-Semiconductor) field effect transistor 17 is formed on a main surface 7 of silicon single-crystalline wafer 1. Heavy metals entering by any means are shown by reference numeral 15.

Heavy metals 15 have a characteristic of gathering at a crystal defect when energy is imparted thereto. Grain boundaries 13 serve to be crystal defects. When energy is imparted to heavy metals 15 in the step of thermal treatment, heavy metals 15 gather at grain boundaries 13. As a result, heavy metals which entered a semiconductor device are removed.
(Theory 2)

Figure 24:
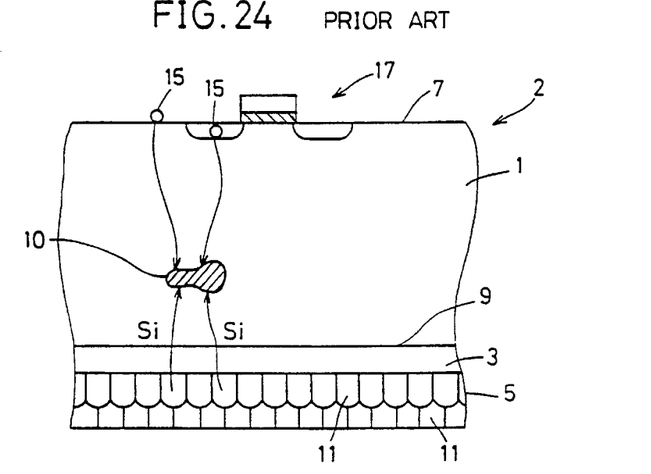
FIG. 24 is a partially enlarged view of a silicon substrate for explaining Theory 2 for gettering.

FIG. 24 is an enlarged cross section of a portion of silicon substrate 2. Description will not be repeated to the same elements as those in FIG. 23 by labeling the same reference numerals. During the step of thermal treatment, silicon in poly-crystalline silicon film 5 enters silicon single-crystalline wafer 1 through natural oxide film 3. As a result, a crystal defect 10 is generated in silicon single-crystalline wafer 1. Heavy metals 15 to which energy is imparted in the step of thermal treatment gather at crystal defect 10.

Figure 25:
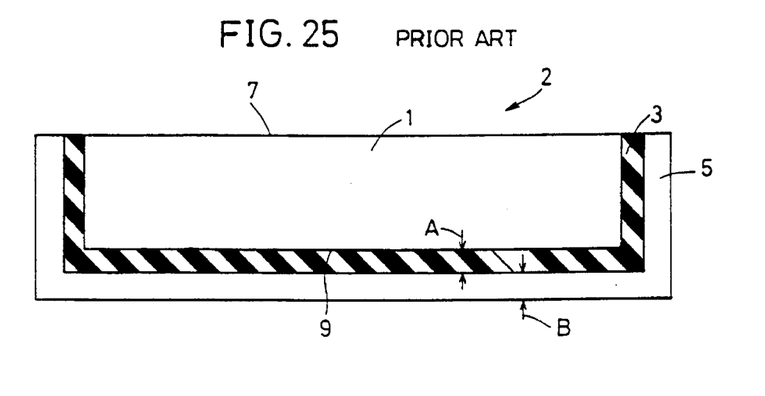
FIG. 25 is a cross section of a conventional silicon substrate.

FIG. 25 is a cross section of a conventional silicon substrate having a poly-crystalline silicon film formed on the rear surface. Silicon substrate 2 includes silicon single-crystalline wafer 1 having natural oxide film 3 formed on rear surface 9 thereof and poly-crystalline silicon film 5 formed on natural oxide film 3. The thickness of natural oxide film 3 indicated at A is approximately 20 Å. The thickness of poly-crystalline silicon film 5 indicated at B is approximately 1 μm. A main surface of silicon single-crystalline wafer 1 is indicated at reference numeral 7, on which semiconductor elements are formed. Such a semiconductor substrate is disclosed in, for example, U.S. Pat. No. 4,053,335.

Figure 26:
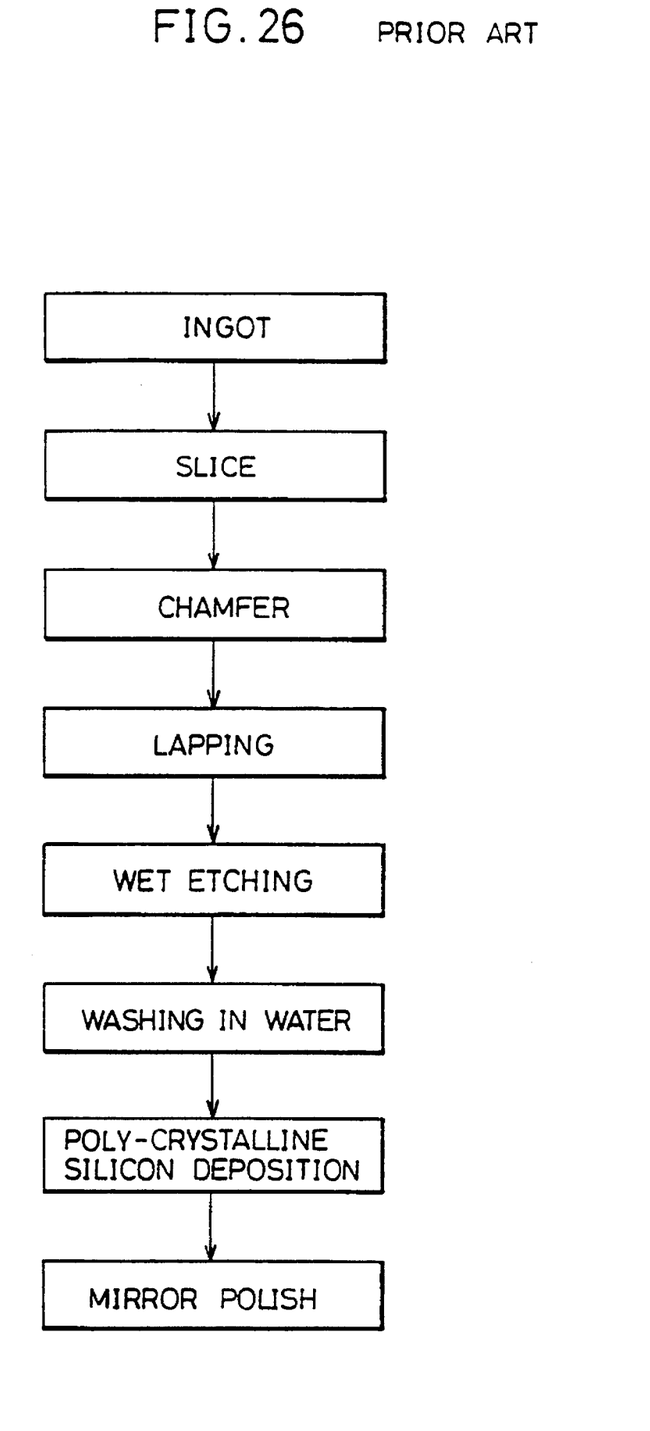
FIG. 26 is a diagram showing the steps in order of a method of manufacturing the conventional silicon substrate.

Brief description will be given to a method of manufacturing a silicon substrate shown in FIG. 25 with reference to FIG. 26. An ingot of silicon single crystal is prepared. This ingot is sliced. Edges of this sliced silicon single-crystalline wafer are chamfered. Chamfering rounds off edge portions of the wafer, thereby preventing edge portions of the wafer from chipping.

The surface of the chamfered wafer is smoothed by lapping and etching. In other words, the surface of the chamfered wafer is roughly ground by lapping. A lapping material, fragments of silicon, a damaged layer and the like are removed from the lapped wafer by etching. The etching solution adhering to the wafer is washed away in water.

Poly-crystalline silicon film 5 is formed on the whole surface of the etched wafer. Natural oxide film 3 is formed naturally on silicon single-crystalline wafer 1 after completion of etching and before formation of a poly-crystalline silicon film.

Main surface 7 of the wafer having a poly-crystalline silicon film formed thereon is then mirror polished. This state is shown in FIG. 25.

However, it was not possible for silicon substrate 2 of a conventional type and having poly-crystalline silicon film 5 formed on rear face 9 of silicon single-crystalline wafer 1 to have satisfactory gettering effect.

SUMMARY OF THE INVENTION

The present invention is provided for solving such conventional problems. One object of the present invention is to provide a semiconductor device with satisfactory gettering effect.

Another object of the present invention is to provide a method of manufacturing a semiconductor substrate with satisfactory gettering effect.

According to an aspect of the present invention, the semiconductor device includes a semiconductor substrate having a main surface suitable for forming semiconductor devices thereon and a rear surface having formed thereon a natural oxide film of no more than 10 Å in thickness, and a layer of gettering sink material formed on the natural oxide film.

According to another aspect of the present invention, the semiconductor device includes a semiconductor substrate of a first conductivity type having a main surface and a rear surface having formed thereon a natural oxide film of no more than 10 Å in thickness, a pair of source/drain regions spaced apart from each other in the main surface of the substrate to form a channel region, a gate electrode formed on the channel region with a gate insulating film interposed therebetween, and a layer of gettering sink material formed on the natural oxide film.

According to still another aspect of the present invention, the semiconductor device includes a semiconductor substrate having a main surface and a rear surface formed thereon a natural oxide film of no more than 10 Å in thickness, a bipolar transistor formed on the main surface of the semiconductor substrate and having an emitter region, a base region and a collector region, and a layer of gettering sink material formed on the natural oxide film.

According to an aspect of the present invention, the method of manufacturing the semiconductor substrate includes the steps of using an etching solution to smooth a surface of a semiconductor wafer, washing the semiconductor wafer in water in order to remove the etching solution, reducing the thickness of a natural oxide film formed as a result of washing on the rear surface of the semiconductor substrate, and forming a layer of a gettering sink material on the natural oxide film.

According to another aspect of the present invention, the method of manufacturing the semiconductor substrate includes the steps of reducing the thickness of the natural oxide film formed on the rear surface of the semiconductor wafer to no more than 10 Å, and forming a layer of gettering sink material on the natural oxide film.

In the above-described aspects of the present invention, the semiconductor device includes a natural oxide film of no more than 10 Å in thickness formed on the rear surface of the semiconductor wafer. Since the thickness of the natural oxide film is made smaller than that of a conventional oxide film, heavy metals travel smoothly from the semiconductor substrate to the layer of gettering sink material in gettering. Atoms in the layer of gettering sink material also travel smoothly to the semiconductor substrate.

In the one aspect of the method of manufacturing the semiconductor substrate according to the present invention, since the natural oxide film is etched before formation of the layer of gettering sink material, it is possible to reduce the thickness of the natural oxide film.

In the another aspect of the method of manufacturing the semiconductor substrate according to the present invention, the thickness of the natural oxide film is made no more than 10 Å before formation of the layer of gettering sink material.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a graph showing the relation between X-ray refraction intensity ratio and Fe concentration.

DESCRIPTION OF THE PREFERRED EMBODIMENTS

Figure 21:
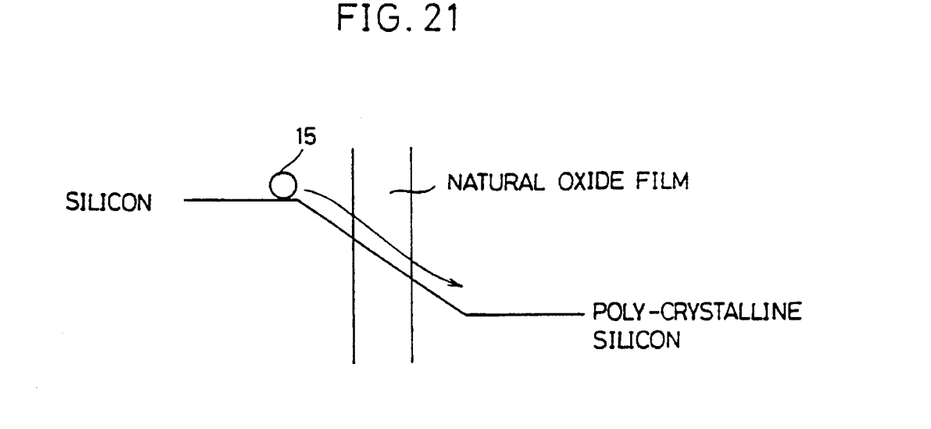
FIG. 21 is a diagram showing a first relation between potential of silicon and potential of poly-crystalline silicon.
Figure 22:
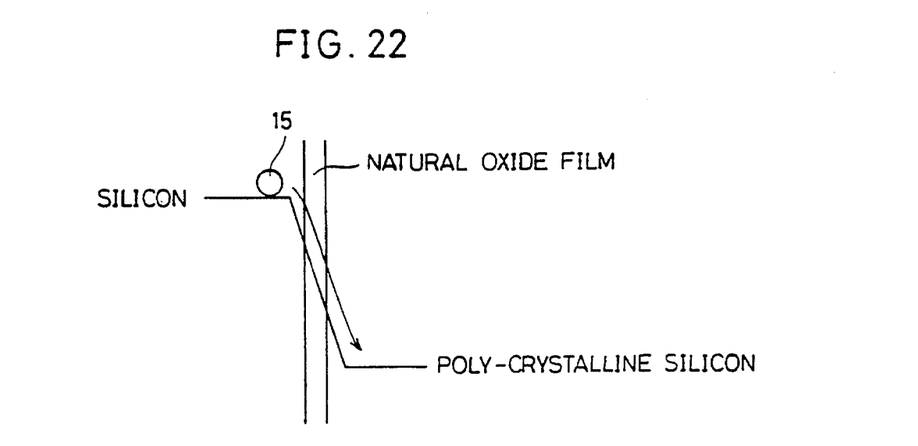
FIG. 22 is a diagram showing a second relation between potential of silicon and potential of poly-crystalline silicon.

The inventor found that gettering effect is enhanced as the thickness of a natural oxide film between the rear surface of a semiconductor wafer and a gettering layer is decreased. The following is the reason therefor. FIGS. 21 and 22 are diagrams showing the relation, per unit area of the natural oxide film, between potential of silicon and potential of poly-crystalline silicon. As shown in FIG. 21, when the thickness of a natural oxide film is large, the difference, per unit area of the natural oxide film, between potential of silicon and potential of poly-crystalline silicon becomes small. Therefore, it becomes difficult for heavy metals 15 entering a silicon substrate to travel to the side of poly-crystalline silicon. It also becomes difficult for Si in the poly-crystalline silicon to travel to the silicon substrate.

Conversely, as shown in FIG. 22, when the thickness of a natural oxide film is small, the difference, per unit area of natural oxide film, between potential of silicon and potential of poly-crystalline silicon becomes larger. Therefore, it becomes easier for heavy metals 15 entering a silicon substrate to travel to the side of poly-crystalline silicon. It also becomes easier for Si in the poly-crystalline silicon to travel to the silicon substrate. Because of the above-described reason, it is considered that gettering effect is enhanced as the thickness of a natural oxide film becomes smaller.

Figure 1:
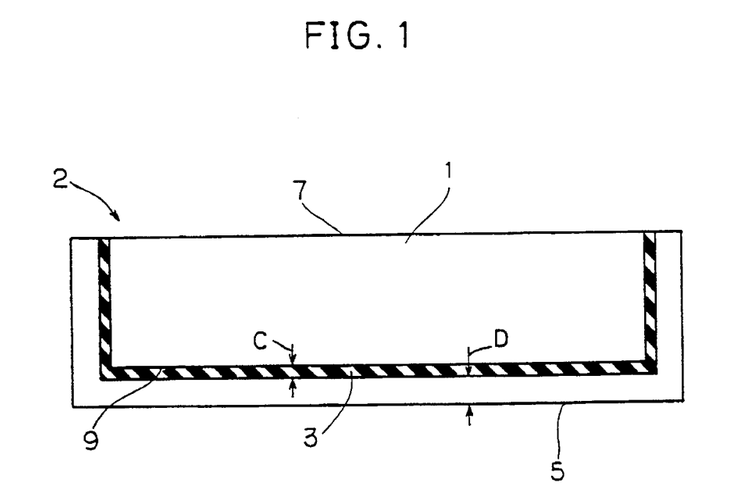
FIG. 1 is a cross section showing one embodiment of a semiconductor substrate according to the present invention.

FIG. 1 is a cross section of one embodiment of the present invention. Rear surface 9 of silicon substrate 2 includes natural oxide film 3 formed thereon inevitably. The thickness of natural oxide film 3 indicated at C is approximately 7 Å. Poly-crystalline silicon film 5 is formed on natural oxide film 3. The thickness of poly-crystalline silicon film 5 indicated at D is approximately 1 μm. The main surface of silicon single-crystalline wafer 1 is indicated at reference numeral 7, on which semiconductor elements are formed.

Figure 2:
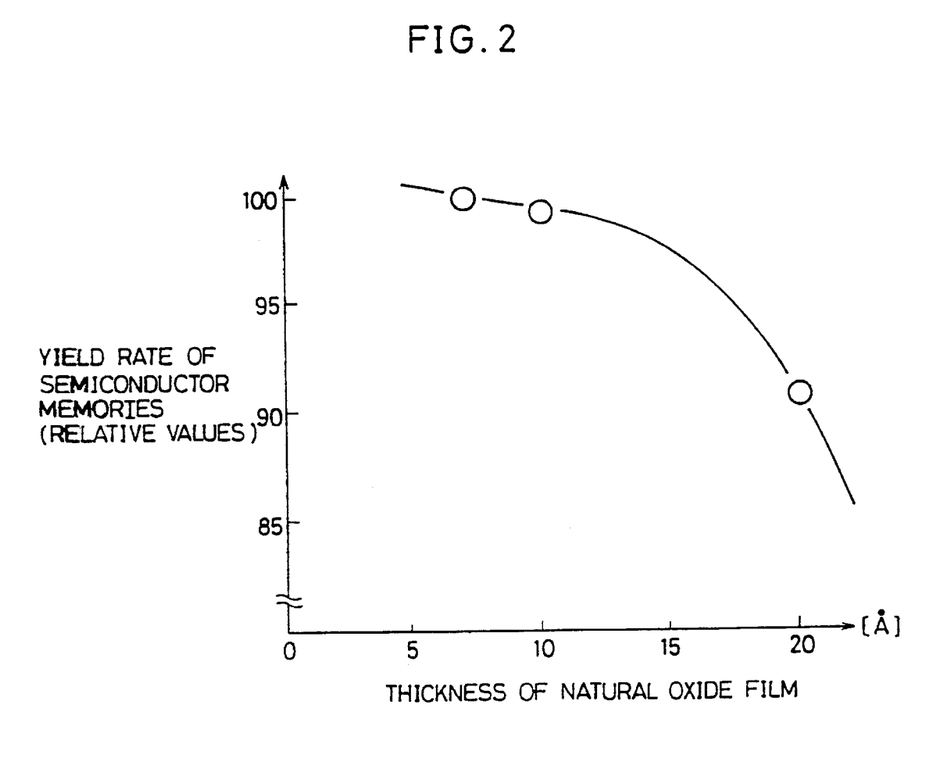
FIG. 2 is a graph showing the relation between the thickness of a natural oxide film and the yield rate of semiconductor memories.

Semiconductor memories were manufactured using silicon substrates having natural oxide film 3 of the thickness of 7 Å, 10 Å and 20 Å formed thereon. The yield rate of these semiconductor memories was calculated. The yield rate is expressed by the following equation.

yield rate=(the number of non-defective chips/the total number of chips)×100

Non-defective chips are chips which passed various tests required for shipping semiconductor memories as products. The result is shown in FIG. 2. As can be seen from FIG. 2, it is understood that the yield rate of semiconductor memories is relatively high when the thickness of the natural oxide film is less than 10 Å.

It is appreciated from FIG. 3 that gettering effect is high when the plane orientation of the surface of the layer of gettering sink material facing the natural oxide film is (2, 2, 0). FIG. 3 is a graph showing the relation between Fe concentration and X-ray refraction intensity ratio. The ordinate shows Fe concentration, and the abscissa shows the ratio of X-ray refraction intensity of plane orientation (2, 2, 0) and that of plane orientation (1, 1, 1). The larger value on the abscissa, the larger number of grains of plane orientation (2, 2, 0). As is seen from FIG. 3, the Fe concentration decreases as the number of grains of plane orientation (2, 2, 0) is increased. Therefore, it is found that gettering effect is increased when the plane orientation of the layer of gettering sink material facing the natural oxide film is (2, 2, 0). It should be noted that gettering conditions are such that the temperature is 950° C., and that the time is ten hours.

A method of manufacturing the silicon substrate shown in FIG. 1 will be described with reference to FIG. 4 hereinafter. An ingot of silicon single-crystalline was sliced and the sliced silicon single-crystalline wafer 1 was chamfered. A cross section thereof is shown in FIG. 5. Reference numeral 19 shows a natural oxide film which was inevitably formed. Since silicon single-crystalline wafer 1 was chamfered, the portions indicated by 21 are round in actuality.

Figure 6:
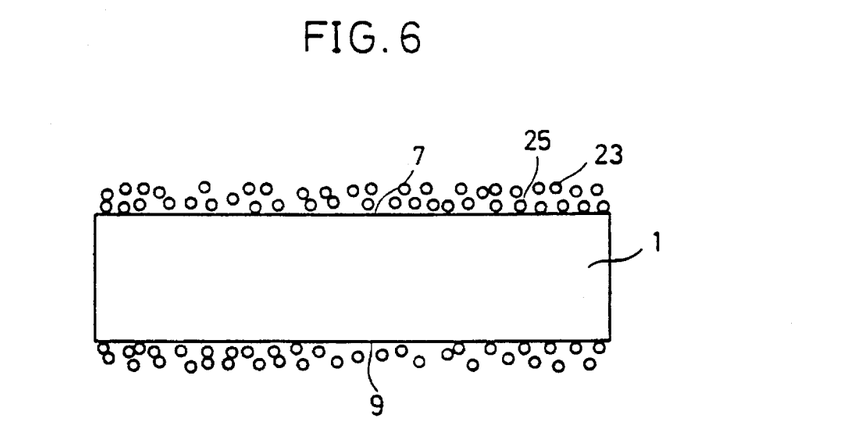

As shown in FIG. 6, main surface 7 and rear surface 9 of silicon single-crystalline wafer 1 were lapped using oxide aluminum grains 23 and water 25. As a result, main surface 7 and rear surface 9 were roughly ground.

Figure 7:
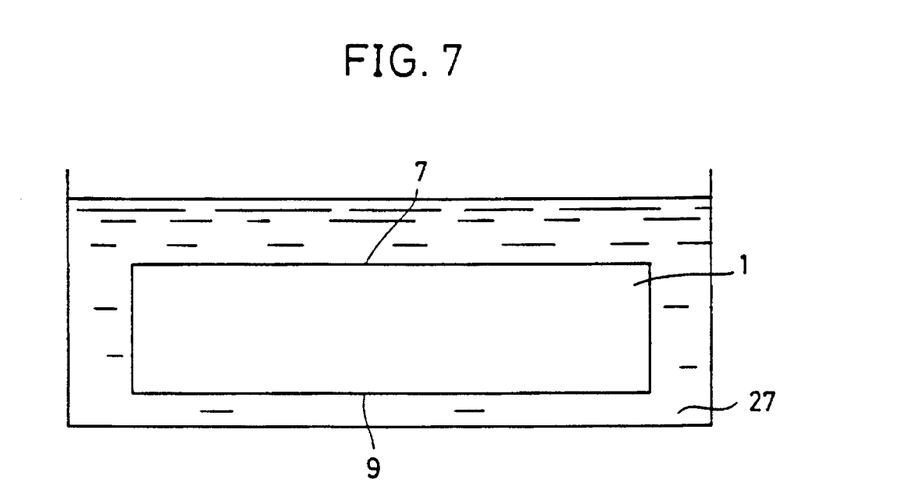

As shown in FIG. 7, the lapped silicon single-crystalline wafer 1 was immersed in an etching solution 27 to etch main surface 7 and rear surface 9 (wet etching 1), thereby removing therefrom a lapping material, fragments of silicon and the like, causing main surface 7 and rear surface 9 to be smoothed. The ratio of ingredients of the etching solution is as follows.

HF:HNO$_3$:CH$_3$COOH=1:1:5

Figure 8:
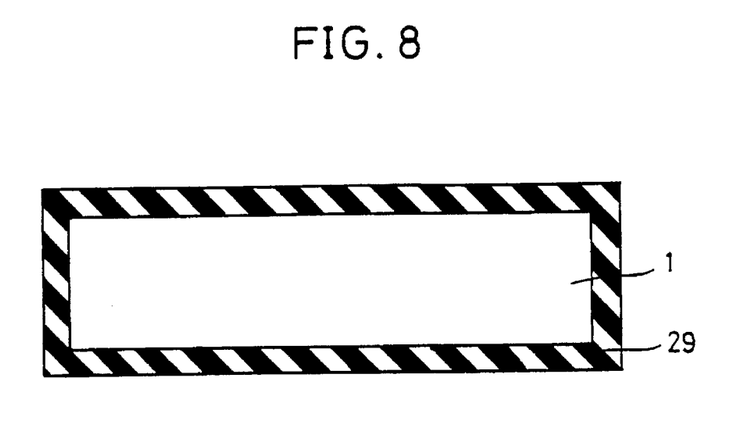

Silicon single-crystalline wafer 1 was washed in water in order to remove the etching solution adhering to silicon single-crystalline wafer 1 (washing 1 in water). At that time, as shown in FIG. 8, natural oxide film 29 is inevitably formed. The longer the time for washing, the larger the thickness of natural oxide film 29. Undiluted etching solution is used in order to remove a layer damaged by lapping left on silicon single-crystalline wafer 1, adhered lapping materials, fragments of silicon and the like. This is because etching effect increases as the concentration of etching solution increases. It takes 20 to 30 minutes to wash the wafer since the etching solution is undiluted. Therefore, the thickness of natural oxide film 29 becomes approximately 8 Å.

In a conventional method, a poly-crystalline silicon film is then formed. However, in this embodiment, the process of removing natural oxide film 29 was carried out. The description therefor will be given in the following.

Figure 9:
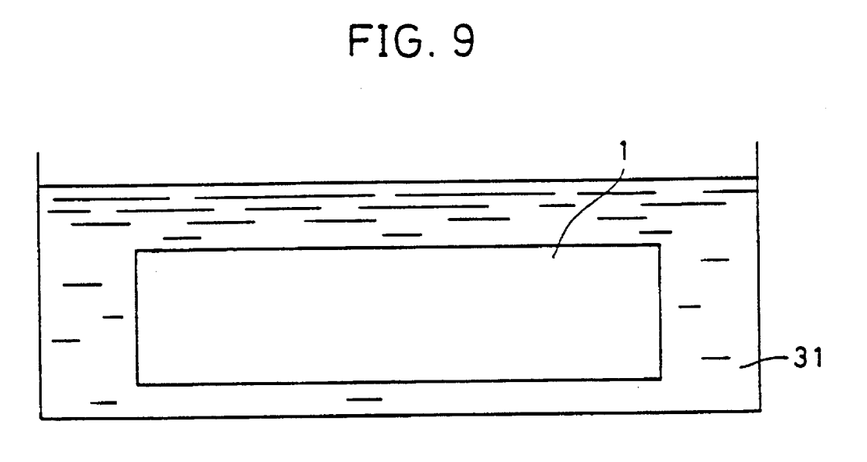

As shown in FIG. 9, silicon single-crystalline wafer 1 from which etching solution shown in FIG. 8 was removed was immersed in a hydrogen fluoride solution 31 (wet etching 2). It is preferable that the concentration of hydrogen fluoride solution 31 is 1–50%, the temperature is 23°–25° C. and the time during which the wafer is immersed is about 5 minutes.

Figure 10:
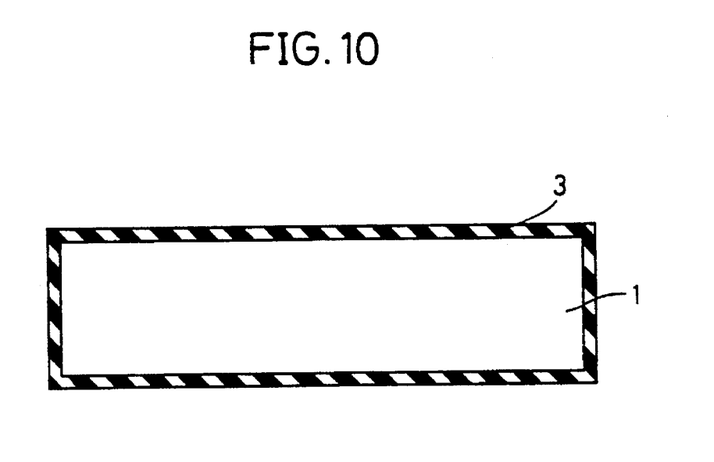

In order to remove hydrogen fluoride solution 31 adhering to silicon single-crystalline wafer 1, silicon single-crystalline wafer 1 was washed in water (washing 2 in water). Since hydrogen fluoride solution 31 removes only the natural oxide film, the concentration of hydrogen fluoride solution 31 is lower than that of etching solution. Therefore, the time for washing can be short and in this embodiment, the time was made about five minutes. Since the time for washing was about five minutes, the thickness of natural oxide film 3 (cf. FIG. 10) formed on silicon single-crystalline wafer 1 was approximately 3 Å.

Figure 11:
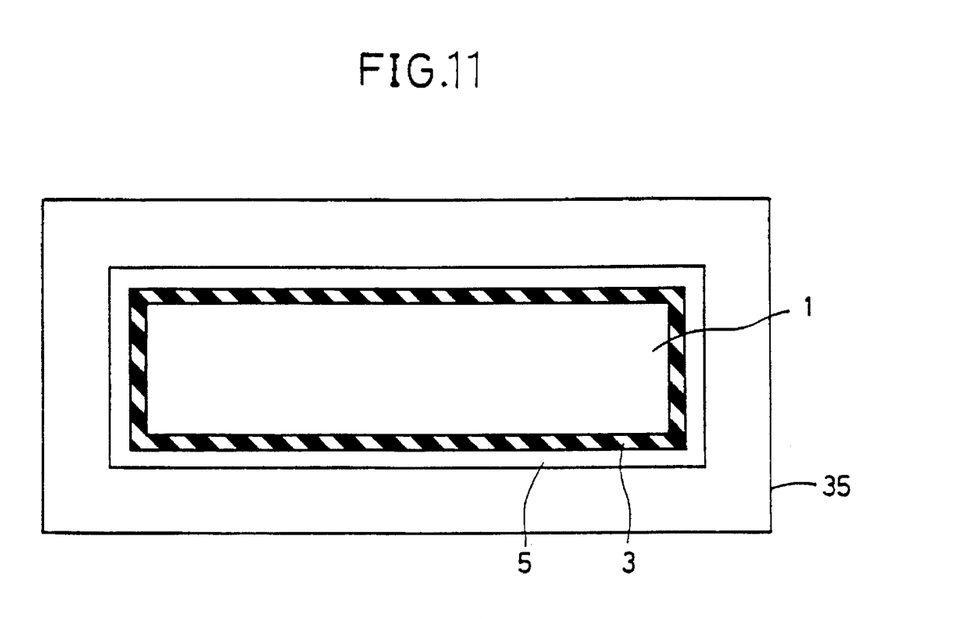
Figure 14:
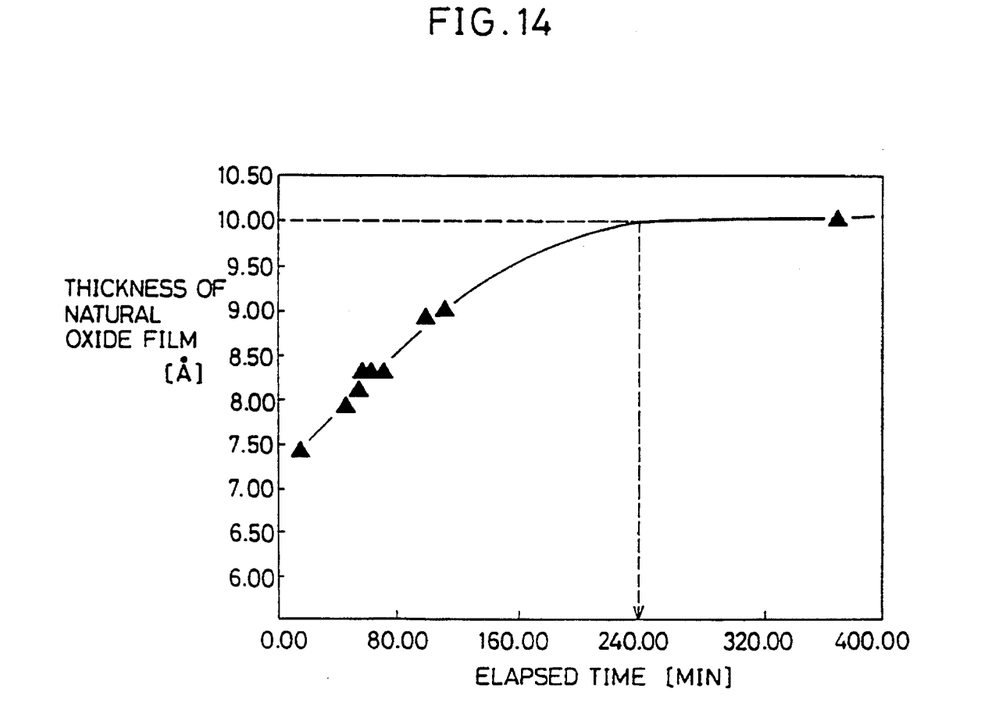
FIG. 14 is a graph showing the relation between the elapsed time of a natural oxide film left in the atmosphere and the thickness of the natural oxide film.

After removing hydrogen fluoride solution 31 adhering to silicon single-crystalline wafer 1, silicon single-crystalline wafer 1 was placed in a CVD furnace 35 shown in FIG. 11 to carry out the process of forming polycrystalline silicon 5 for four hours or less. The reason will be described with reference to FIG. 14. FIG. 14 is a graph showing the relation between the thickness of a newly formed natural oxide film and the elapsed time of the silicon single-crystalline wafer left in the atmosphere having its former natural oxide film removed therefrom. As can be seen from FIG. 14, it is possible to make the thickness of the natural oxide film less than 10 Å when the elapsed time of the wafer left in the atmosphere is four hours or less. After four hours, the curve of the graph gradually rises. The thickness of the natural oxide film becomes 20 Å.

Figure 12:
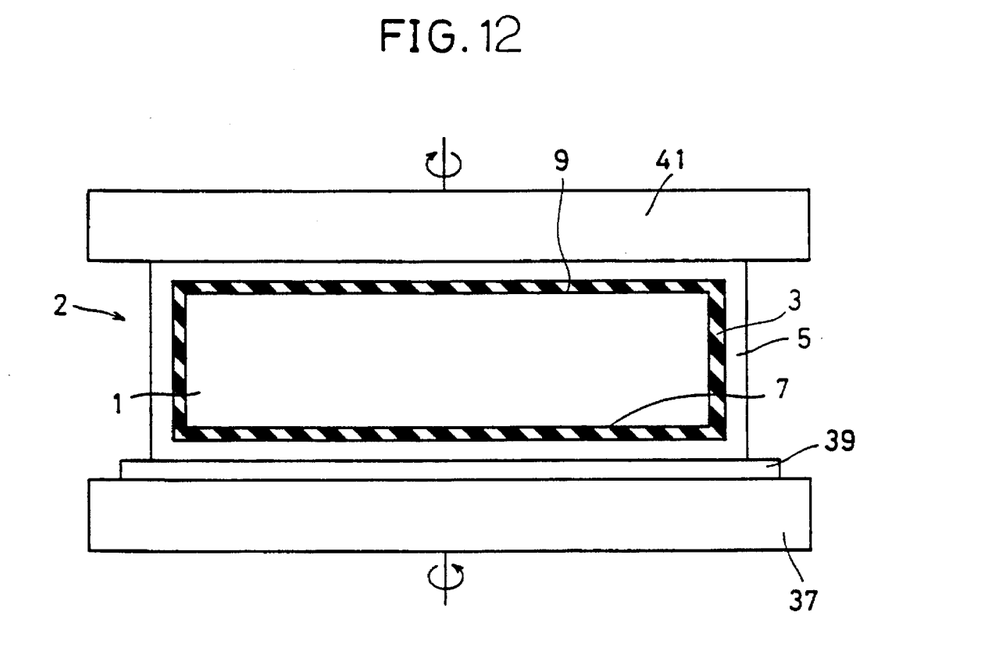
Figure 13:
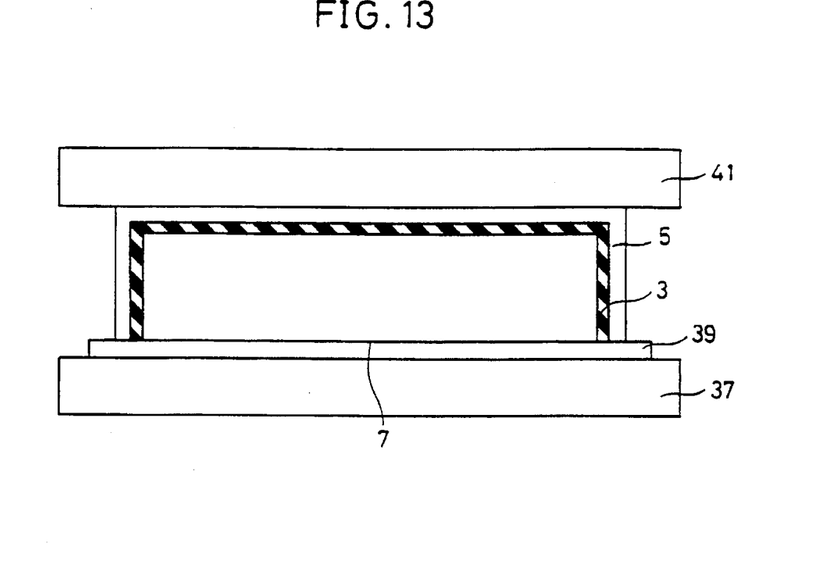

As shown in FIG. 12, silicon substrate 2 was mirror polished after formation of poly-crystalline silicon film 5. Rear surface 9 of silicon single-crystalline wafer 1 was adhered to a ceramic plate 41 using wax. A polishing cloth 39 containing a mixed lubricant of colloidal silica and NaOH is provided on a surface plate 37. Main surface 7 of silicon single-crystalline wafer 1 was subjected to polishing cloth 39. Main surface 7 was polished by rotating ceramic plate 41 and surface plate 37. This is shown in FIG. 13. As a result, main surface 7 is mirror polished.

A gettering thin film which can be used in the present invention is of, for example, non-doped poly-crystalline silicon, doped poly-crystalline silicon, amorphous silicon, BSG (Boro-Silicate Glass), PSG (Phospho-Silicate Glass), BPSG (Boro-Phospho Silicate Glass), silicon carbide, and boron nitride. When BSG, PSG, or BPSG is used as a gettering thin film, gettering is carried out only on gettering theory 2 described in the description of the prior art. Atoms traveling into a semiconductor substrate to acquire a crystal defect are as in the following. In the case of non-doped poly-crystalline silicon, a silicon atom, in the case of doped poly-crystalline silicon, a silicon atom and doped impurity, in the case of BSG, a boron atom, in the case of PSG, a phosphorus atom, in the case of BPSG, a boron atom and a phosphorus atom, in the case of silicon carbide, a silicon atom and a carbon atom, in the case of boron nitride, a boron atom and a nitride atom.

Although the surface of the silicon single-crystalline wafer is smoothed by lapping and wet etching 1 in this embodiment, it may be smoothed only by wet etching.

Although a silicon single-crystalline wafer is described in this embodiment, it may be a wafer of GaAs and the like.

Although natural oxide film 29 is removed using hydrogen fluoride solution 31 in this embodiment as shown in FIG. 9, it may be removed by dry etching in a plasma atmosphere.

In this embodiment, silicon single-crystalline wafer 1 is exposed in the atmosphere one time between the step shown in FIG. 9 and the step shown in FIG. 11. However, if etching and formation of a poly-crystalline silicon film are carried out in the same chamber, exposure of silicon single-crystalline wafer 1 in the atmosphere can be avoided. As a result, the thickness of a newly formed natural oxide film after etching a natural oxide film and before forming a poly-crystalline silicon film can be made further smaller. In particular, if the concentration of oxide within the chamber is made 0, it is possible to eliminate a natural oxide film formed between a poly-crystalline silicon film and a silicon single-crystalline wafer.

Figure 15:
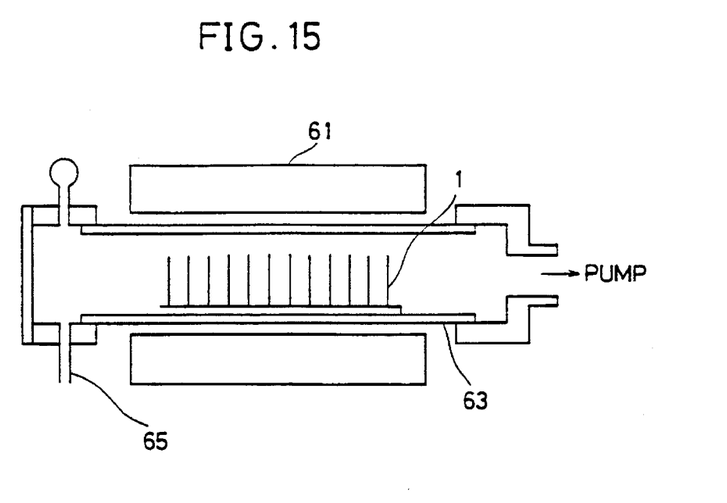
FIG. 15 is a schematic diagram showing an apparatus used in another example of the manufacturing method of one embodiment of the semiconductor substrate according to the present invention.

FIG. 15 is a schematic diagram of a device in which etching and formation of a poly-crystalline silicon film can be carried out within the same chamber. A heater 61 is disposed around a chamber 63. Silicon single-crystalline wafer 1 is placed within chamber 63. Silicon single-crystalline wafer 1 is an etched wafer after completion of the step of washing, that is, silicon single-crystalline wafer 1 shown in FIG. 8.

HF gas is first made to flow within chamber 63 through a gas inlet 65 to remove natural oxide film 29 shown in FIG. 8. After removal of natural oxide film 29, SiH$_4$ gas is introduced within chamber 63 through gas inlet 65 to form poly-crystalline silicon film 5 shown in FIG. 11.

Figure 4:
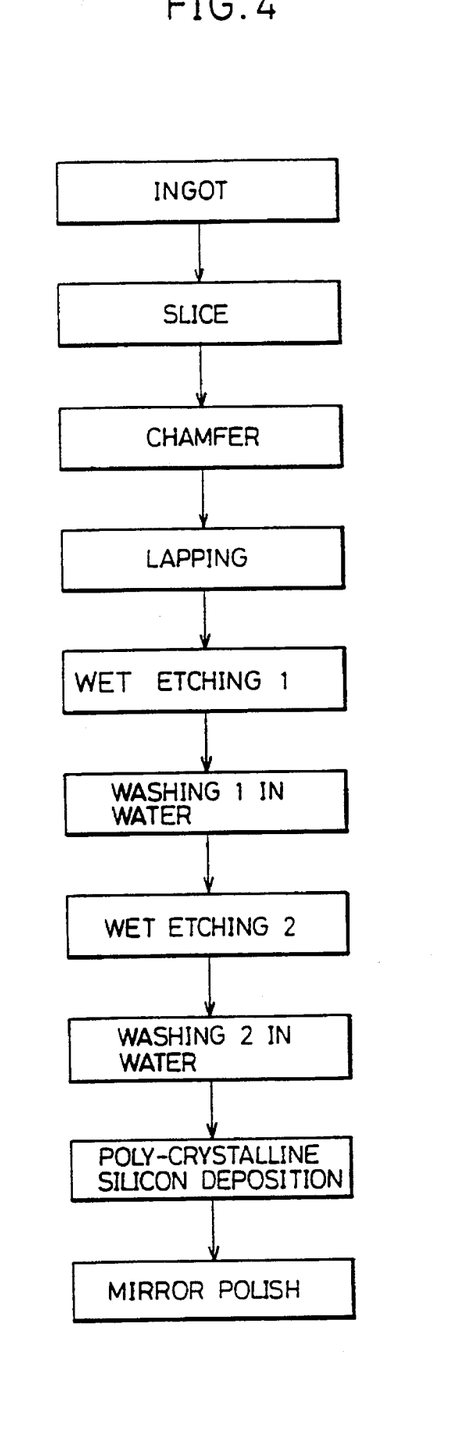
FIG. 4 is a diagram showing the steps in order of manufacturing the semiconductor substrate according to one embodiment of the present invention.
Figure 5:
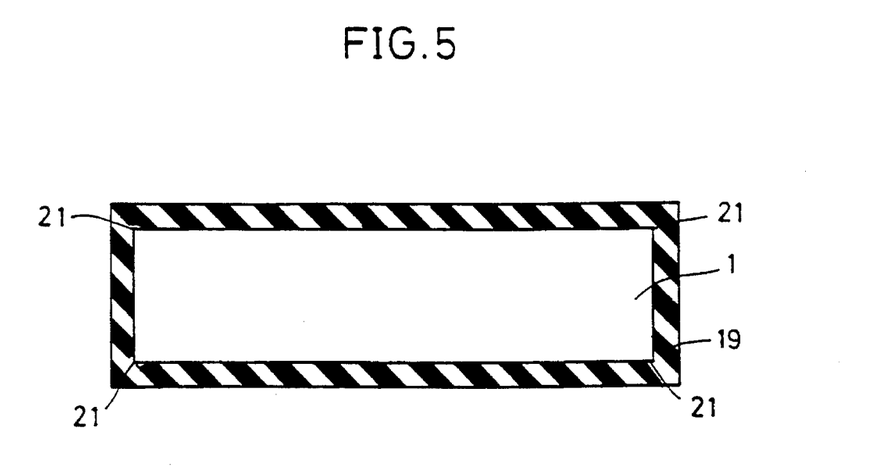
FIG. 5 to FIG. 13 are cross sections of the first to the ninth steps of the manufacturing method of one embodiment of the semiconductor substrate according to the present invention.
Figure 16:
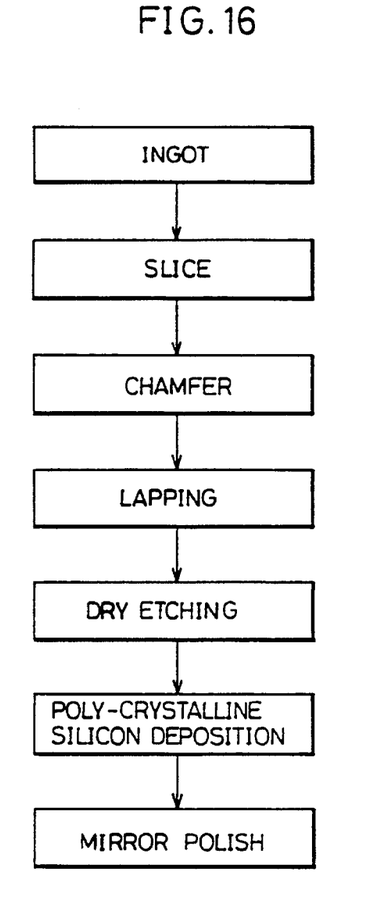
FIG. 16 is a diagram showing the steps of still another example of the manufacturing method of one embodiment of the semiconductor substrate according to the present invention.

As shown in FIG. 4, although the surface of the silicon single-crystalline wafer is smoothed by lapping and wet etching 1 in this embodiment, it may be smoothed by lapping and dry etching as shown in FIG. 16. After removing in a chamber the natural oxide film formed on the rear surface of the silicon single-crystalline wafer by the dry etching, the poly-crystalline silicon film serving as a layer of gettering sink material may be formed in the same chamber.

Figure 17:
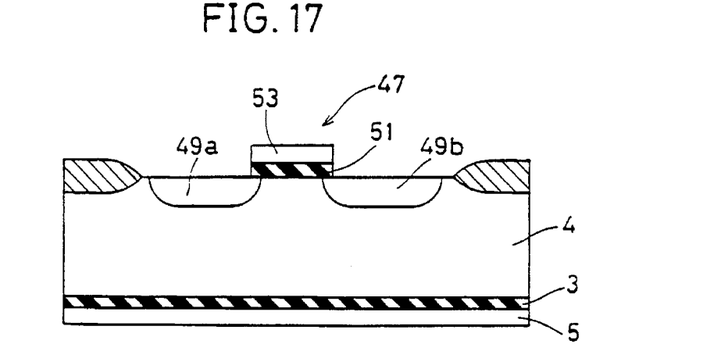
FIG. 17 is a cross section of an MOS transistor manufactured using one embodiment of the semiconductor substrate according to the present invention.

FIG. 17 is an MOS field effect transistor fabricated using one embodiment of the present invention. Natural oxide film 3 and poly-crystalline silicon film 5 are formed in order on the rear surface of single-crystalline silicon 4. MOS field effect transistor 47 is formed on the main surface of single-crystalline silicon 4. MOS field effect transistor 47 is provided with source/drain 49a, 49b formed to be spaced in single-crystalline silicon 4, a gate insulating film 51 and a gate electrode 53 formed on gate insulating film 51.

Figure 18:
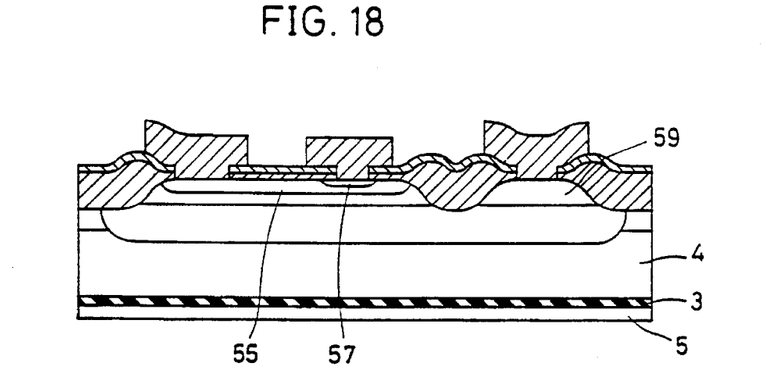
FIG. 18 is a cross section of a bipolar transistor manufactured using one embodiment of the semiconductor substrate according to the present invention.

FIG. 18 is a cross section of a bipolar transistor fabricated using one embodiment of the present invention. The base region, the emitter region and the collector region are indicated at reference numerals 55, 57 and 59, respectively.

Figure 19:
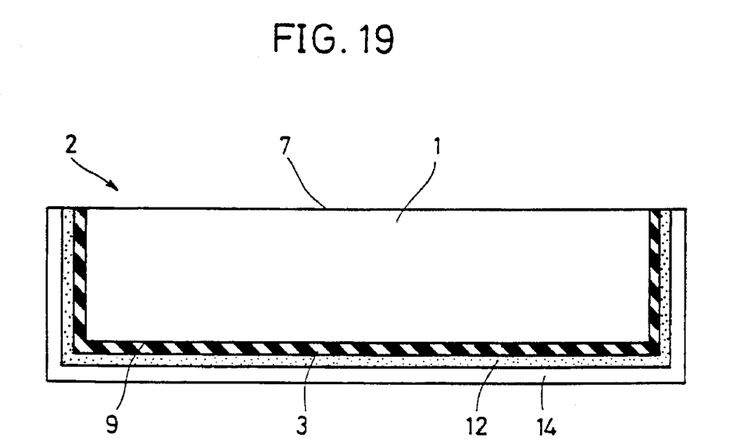
FIG. 19 is a cross section showing another embodiment of the semiconductor substrate according to the present invention.

FIG. 19 is a cross section of another embodiment of the present invention. The same reference numerals as those of FIG. 1 are given to the same elements, and the description will not be repeated. In the another embodiment of the present invention, a layer of gettering sink material is laminated of a non-doped poly-crystalline silicon film 14 and a doped poly-crystalline silicon film 12. In other words, doped poly-crystalline silicon film 12 is formed on natural oxide film 3, and non-doped poly-crystalline silicon film 14 is formed on doped poly-crystalline silicon film 12. When impurity is doped in the poly-crystalline silicon film, the doped impurity travels into a silicon single-crystalline wafer to acquire a crystal defect. Therefore, gettering effect is more increased when impurity is doped in the layer of gettering sink material. However, if impurity is doped in the whole layer, the following inconvenience is caused.

Figure 20:
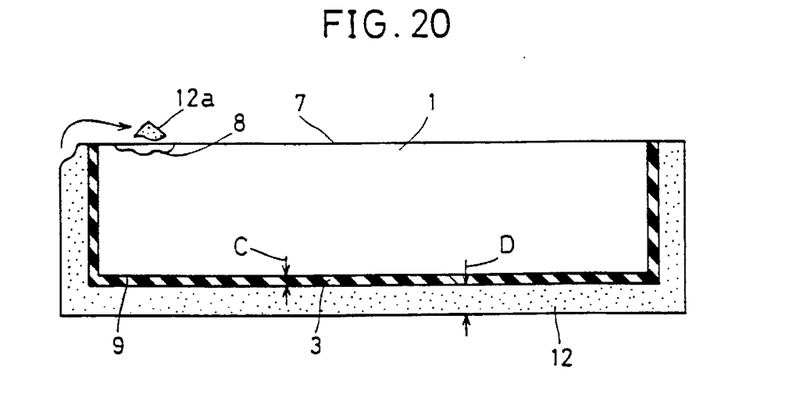
FIG. 20 is a cross section of a semiconductor substrate having a gettering thin film formed only of a doped poly-crystalline silicon film.

FIG. 20 is a cross section of a silicon substrate having a layer of gettering sink material only of a doped poly-crystalline silicon film. The surface of the layer is chipped by any means, and the chipped piece is sometimes placed on main surface 7. In the case of doped poly-crystalline silicon film 12, when a chipped doped poly-crystalline silicon film piece 12a is placed on main surface 7, impurity in doped poly-crystalline silicon film piece 12a is diffused into silicon single-crystalline wafer 1, sometimes causing an impurity region 8 to be formed. If the surface portion of the layer is formed of non-doped poly-crystalline silicon film 14, as shown in FIG. 19, the above-described inconvenience is not caused.

In the aspects of the semiconductor device according to the present invention, the thickness of the natural oxide film formed on the rear surface of the semiconductor wafer is made less than 10 Å. Therefore, it is possible to enhance gettering effect, thereby increasing the yield rate of the semiconductor devices.

In the one aspect of the method of manufacturing the semiconductor substrate according to the present invention, the natural oxide film is etched before formation of a layer of gettering sink material. Therefore, it is possible to make the thickness of the natural oxide film between the layer and the rear surface of the semiconductor wafer thinner than that of a conventional one.

In the another aspect of the method of manufacturing the semiconductor substrate according to the present invention, the thickness of the natural oxide film is made less than 10 Å before formation of the layer of gettering sink material. Therefore, it is possible to manufacture semiconductor substrates having a natural oxide film of no more than 10 Å in thickness formed between the layer and the rear surface of the semiconductor wafer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor substrate from a wafer of semiconductor material, comprising the steps of:

using a first etching solution to smooth a surface of the wafer;

washing the wafer in water to remove said first etching solution;

reducing the thickness of an oxide film naturally formed on the rear surface of said wafer as a result of washing; and forming a gettering sink material directly on the remaining natural oxide film.

2. The method according to claim 1, including the step of grinding front and rear surfaces of said wafer prior to etching.

3. The method of manufacturing a semiconductor substrate according to claim 1, wherein said step of reducing the thickness of the natural oxide film includes the steps of reducing the thickness of said natural oxide film by using a second etching solution, and washing said wafer in water to remove said second etching solution.

4. The method of manufacturing a semiconductor substrate according to claim 3, wherein time required for removing said second etching solution is shorter than time required for removing said first etching solution.

5. The method of manufacturing a semiconductor substrate according to claim 1, wherein said step of reducing the thickness of said natural oxide film includes the step of reducing the thickness of said natural oxide film to no more than 10 Å.

6. A method of manufacturing a semiconductor substrate from a semiconductor wafer having a main surface and a rear surface, comprising the steps of:

reducing the thickness of a natural oxide film formed on said rear surface to no more than 10 Å; and forming a layer of gettering sink material directly on said natural oxide film.

7. The method of manufacturing a semiconductor substrate according to claim 6, wherein said step of reducing the thickness of said natural oxide film to no more than 10 Å includes the steps of reducing the thickness of said natural oxide film from the rear surface of said semiconductor wafer by etching, and initiating formation of said layer of gettering sink material within four hours after reducing the thickness of said natural oxide film.

8. The method of manufacturing a semiconductor substrate according to claim 6, further comprising the step of smoothing the main surface of said semiconductor wafer prior to the step of reducing the thickness of said natural oxide film to no more than 10 Å.

9. The method of manufacturing a semiconductor substrate according to claim 8, wherein said step of smoothing includes etching the main surface of said semiconductor wafer by using a first etching solution.

10. The method of manufacturing a semiconductor substrate according to claim 8, wherein said step of smoothing the main surface includes the step of lapping the main surface of said semiconductor wafer.

11. The method of manufacturing a semiconductor substrate according to claim 8, wherein said step of smoothing the main surface includes the step of etching the main surface of said semiconductor wafer by dry etching.

12. The method of manufacturing a semiconductor substrate according to claim 8, wherein said step of smoothing the main surface includes the steps of immersing said semiconductor wafer in a first etching solution to smooth the main surface and the rear surface of said semiconductor wafer, and washing said semiconductor wafer in water in order to remove said first etching solution from the main surface and the rear surface of said semiconductor wafer.

13. The method of manufacturing a semiconductor substrate according to claim 12, wherein said step of reducing the thickness of said natural oxide film to no more than 10 Å includes the step of etching by a second etching solution said natural oxide film formed on the rear surface of said semiconductor wafer during said step of washing.

14. The method of manufacturing a semiconductor substrate according to claim 13, wherein said second etching solution is hydrogen fluoride.

15. The method of manufacturing a semiconductor substrate according to claim 6, wherein said step of reducing the thickness of the natural oxide film to no more than 10 Å includes the steps of:

reducing the thickness of said natural oxide film by dry etching in a chamber; and forming said layer of gettering sink material after said step of reducing the thickness of the natural oxide film in the same chamber.

* * * * *